US010418515B2

(12) United States Patent
Wicke et al.

(10) Patent No.: US 10,418,515 B2
(45) Date of Patent: Sep. 17, 2019

(54) OPTOELECTRONIC LIGHTING DEVICE

(71) Applicant: OSRAM Opto Semiconductors GmbH, Regensburg (DE)

(72) Inventors: Markus Wicke, Regensburg (DE); Michael Wittmann, Alteglofsheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/746,625

(22) PCT Filed: Jul. 21, 2016

(86) PCT No.: PCT/EP2016/067453
§ 371 (c)(1),
(2) Date: Jan. 22, 2018

(87) PCT Pub. No.: WO2017/013225
PCT Pub. Date: Jan. 26, 2017

(65) Prior Publication Data
US 2018/0219125 A1    Aug. 2, 2018

(30) Foreign Application Priority Data
Jul. 23, 2015   (DE) .................. 10 2015 112 042

(51) Int. Cl.
*H01L 33/08*    (2010.01)
*H01L 33/50*    (2010.01)
(Continued)

(52) U.S. Cl.
CPC ............ *H01L 33/08* (2013.01); *H01L 33/504* (2013.01); *H01L 33/56* (2013.01); *H01L 33/60* (2013.01);
(Continued)

(58) Field of Classification Search
CPC ....... H01L 33/08; H01L 33/504; H01L 33/56; H01L 33/60; H01L 33/62
See application file for complete search history.

(56) References Cited

U.S. PATENT DOCUMENTS 6,800,996 B2 * 10/2004 Nagai ................. H01L 25/0753
257/E25.02
7,456,499 B2 * 11/2008 Loh ....................... H01L 33/486
257/675

(Continued)

FOREIGN PATENT DOCUMENTS

DE    10 2006 035 635 A1    2/2008
DE    10 2009 015 313 A1    9/2010
(Continued)

*Primary Examiner* — Ida M Soward
(74) *Attorney, Agent, or Firm* — DLA Piper LLP (US)

(57) ABSTRACT

An optoelectronic lighting device includes a black housing including a cavity, wherein the cavity includes a base, a semiconductor component is arranged on the base of the cavity with an underside of a main body facing the base, and the cavity is filled with a reflective material from the base up to a predetermined height, which is smaller than a height of a top side of the main body relative to the base of the cavity such that electromagnetic radiation emerging from the main body through side faces may be reflected by the reflective material back in the direction of the side faces to couple reflected electromagnetic radiation into the main body such that at least part of the electromagnetic radiation coupled in may emerge again from the main body through the top side of the main body.

19 Claims, 3 Drawing Sheets

(51) Int. Cl.
  *H01L 33/56* (2010.01)
  *H01L 33/60* (2010.01)
  *H01L 33/62* (2010.01)
  *H01L 33/58* (2010.01)

(52) U.S. Cl.
  CPC .............. *H01L 33/62* (2013.01); *H01L 33/58* (2013.01); *H01L 2224/48091* (2013.01); *H01L 2224/48247* (2013.01); *H01L 2224/48257* (2013.01)

(56) References Cited

U.S. PATENT DOCUMENTS

| | | | | |
|---|---|---|---|---|
| 7,586,190 B2 * | 9/2009 | Bogner | .................. | H01L 33/64 257/100 |
| 7,906,794 B2 * | 3/2011 | Harrah | .................. | H01L 33/56 257/100 |
| 7,933,059 B2 * | 4/2011 | Nishino | ............. | G02B 26/0841 359/290 |
| 8,044,418 B2 * | 10/2011 | Loh | ...................... | H01L 33/483 257/666 |
| 8,154,043 B2 * | 4/2012 | Andrews | ................. | H01L 33/58 257/98 |
| 8,193,547 B2 * | 6/2012 | Loh | ...................... | H01L 33/642 257/100 |
| 8,269,246 B2 * | 9/2012 | Min | ........................ | H01L 33/38 257/98 |
| 8,373,182 B2 | 2/2013 | Seko et al. | | |
| 8,461,609 B2 * | 6/2013 | Oh | ........................ | H01L 33/486 257/98 |
| 8,519,944 B2 * | 8/2013 | Campisi | .................. | G02F 1/167 345/107 |
| 8,619,352 B2 * | 12/2013 | Maeda | ............... | G02B 26/0841 359/290 |
| 8,625,058 B2 * | 1/2014 | Kozuma | .................. | G01J 1/02 257/294 |
| 8,669,572 B2 * | 3/2014 | Leung | .................. | H01L 33/486 257/98 |
| 8,692,275 B2 * | 4/2014 | Jaeger | ..................... | H01L 33/60 257/98 |
| 8,735,928 B2 * | 5/2014 | Jager | ................... | H01L 31/0203 257/103 |
| 8,757,833 B2 * | 6/2014 | You | ........................ | H01L 33/486 362/235 |
| 8,759,841 B2 * | 6/2014 | Hwang | .................... | H01L 33/44 257/680 |
| 8,890,297 B2 * | 11/2014 | Won | ........................ | H01L 33/48 257/100 |
| 8,941,131 B2 * | 1/2015 | Inoue | ...................... | H01L 33/08 257/100 |
| 9,249,963 B2 * | 2/2016 | Oh | ........................ | H01L 33/60 |
| 9,269,879 B2 * | 2/2016 | Kim | ...................... | H01L 33/60 |
| 9,337,397 B2 * | 5/2016 | Wittmann | ........... | H01L 25/0753 |
| 9,419,190 B2 | 8/2016 | Barth et al. | | |
| 2007/0262336 A1 * | 11/2007 | Tamaki | ................... | H01L 33/60 257/98 |
| 2009/0039982 A1 | 2/2009 | Andoh et al. | | |
| 2010/0073907 A1 * | 3/2010 | Wanninger | ................ | G02B 3/04 362/97.1 |
| 2010/0230694 A1 * | 9/2010 | Arndt | ..................... | H01L 33/486 257/98 |
| 2010/0327307 A1 * | 12/2010 | Ruhnau | ............... | H01L 31/0203 257/98 |
| 2012/0235169 A1 | 9/2012 | Seko et al. | | |
| 2012/0286308 A1 * | 11/2012 | Lai | ........................ | H01L 33/507 257/98 |
| 2012/0307481 A1 * | 12/2012 | Joo | ........................ | H01L 33/60 362/97.1 |
| 2014/0217444 A1 | 8/2014 | Keith et al. | | |
| 2015/0323757 A1 * | 11/2015 | Bone | ........................ | G02B 3/02 359/819 |
| 2016/0254423 A1 * | 9/2016 | Bergmann | ............... | H01L 33/54 257/89 |
| 2017/0018538 A1 * | 1/2017 | Tiwari | ................ | H01L 25/0753 |

FOREIGN PATENT DOCUMENTS

| | | |
|---|---|---|
| DE | 10 2009 039 982 A1 | 3/2011 |
| DE | 10 2010 027253 A1 | 1/2012 |
| DE | 10 2011 079 403 A1 | 1/2013 |
| DE | 10 2012 101 102 A1 | 8/2013 |
| EP | 2 144 305 A1 | 1/2010 |
| EP | 2 216 834 A1 | 8/2010 |
| JP | 2010-157638 A | 7/2010 |
| WO | 2012/038483 A2 | 3/2012 |

\* cited by examiner

OPTOELECTRONIC LIGHTING DEVICE

TECHNICAL FIELD

This disclosure relates to an optoelectronic lighting device, to a method of producing an optoelectronic lighting device and a display apparatus.

BACKGROUND

RGB-LEDs (RGB: red, green blue; LED: "Light-emitting diode" or single-color LEDs) are used in video walls, display panels (known as: VMS=variable message signs) and relatively large screens. To obtain a high contrast image, the LEDs must appear as black as possible in the switched-off state and be as bright as possible in the switched-on state. Black housing materials are therefore used. Volume-emitting chips (such as InGaN or sapphire chips), owing to their wide emission characteristic, rely on housings having good reflectivity, however, to couple out as much light as possible. Therefore, LEDs comprising black housings and volume-emitting chips comprise a very low brightness.

It could therefore be helpful to provide an efficient concept enabling an efficient coupling-out of light in the case of an optoelectronic semiconductor component while maintaining a high contrast.

SUMMARY

We provide an optoelectronic lighting device including at least one optoelectronic semiconductor component including a main body including a top side and an underside opposite the top side and each including two opposite side faces connecting the top side to the underside, and a black housing including a cavity, wherein the cavity includes a base, the semiconductor component is arranged on the base of the cavity with the underside of the main body facing the base, and the cavity is filled with a reflective material from the base up to a predetermined height, which is smaller than a height of the top side of the main body relative to the base of the cavity such that electromagnetic radiation emerging from the main body through the side faces may be reflected by the reflective material back in the direction of the side faces to couple the reflected electromagnetic radiation into the main body such that at least part of the electromagnetic radiation coupled in may emerge again from the main body through the top side of the main body.

We also provide a method of producing an optoelectronic lighting device including providing at least one optoelectronic semiconductor component, including a main body including a top side and an underside opposite the top side and each including two opposite side faces connecting the top side to the underside, providing a black housing including a cavity, wherein the cavity includes a base, arranging the semiconductor component on the base of the cavity with the underside of the main body facing the base, and filling the cavity with a reflective material from the base up to a predetermined height, which is smaller than a height of the top side of the main body relative to the base of the cavity such that electromagnetic radiation emerging from the main body through the side faces may be reflected by the reflective material back in the direction of the side faces to couple the reflected electromagnetic radiation into the main body such that at least part of the electromagnetic radiation coupled in may emerge again from the main body through the top side of the main body.

We further provide a display apparatus including the optoelectronic lighting device including at least one optoelectronic semiconductor component including a main body including a top side and an underside opposite the top side and each including two opposite side faces connecting the top side to the underside, and a black housing including a cavity, wherein the cavity includes a base, the semiconductor component is arranged on the base of the cavity with the underside of the main body facing the base, and the cavity is filled with a reflective material from the base up to a predetermined height, which is smaller than a height of the top side of the main body relative to the base of the cavity such that electromagnetic radiation emerging from the main body through the side faces may be reflected by the reflective material back in the direction of the side faces to couple the reflected electromagnetic radiation into the main body such that at least part of the electromagnetic radiation coupled in may emerge again from the main body through the top side of the main body.

LIST OF REFERENCE SIGNS

Figure 1:
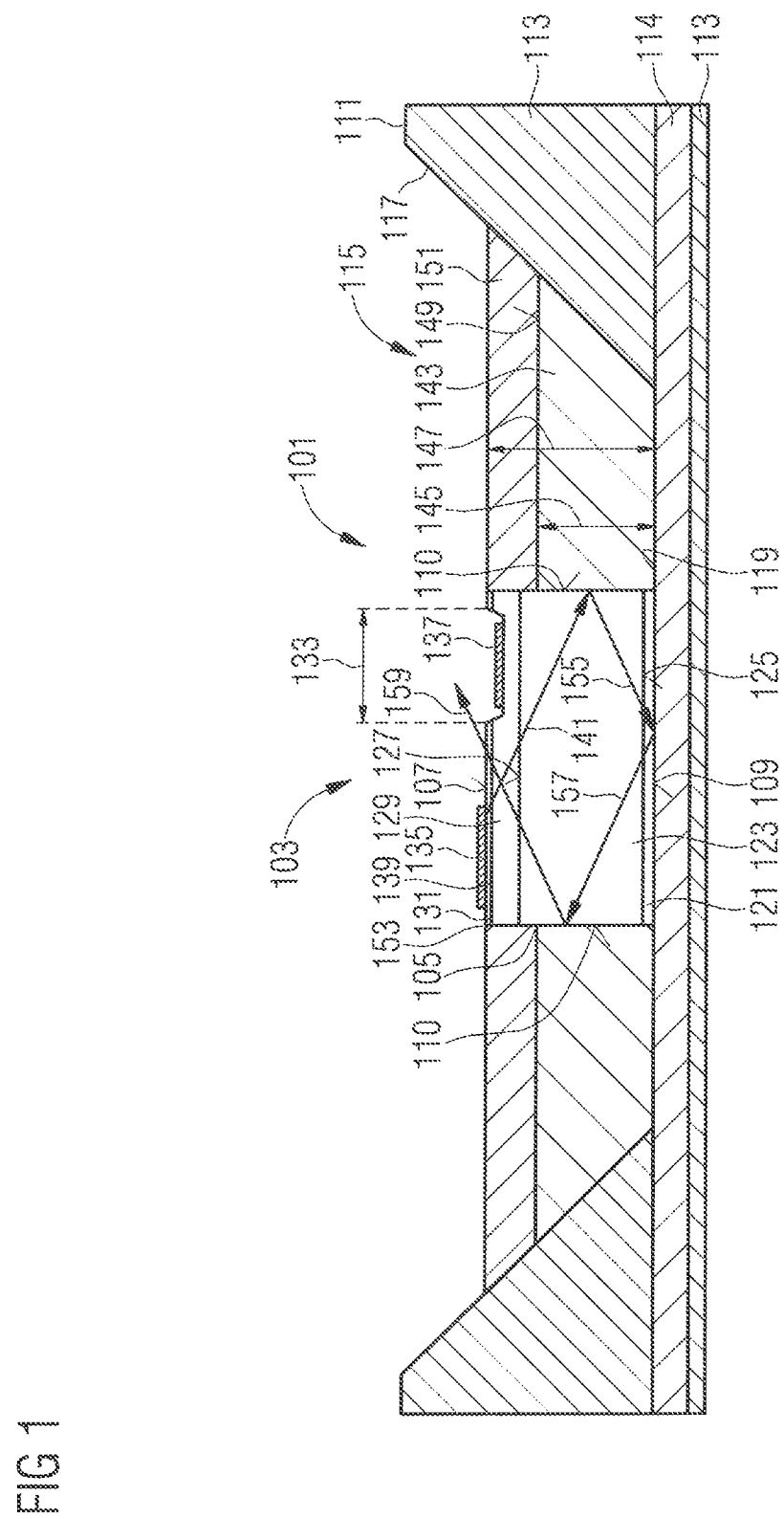
FIG. 1 shows an optoelectronic lighting device.

101 Optoelectronic lighting device
103 Optoelectronic semiconductor component
105 Main body
107 Top side of the main body
109 Underside of the main body
110 Side face
111 Housing
113 Housing frame
114 Leadframe
115 Cavity
117 Wall
119 Base
121 Bragg reflector
123 Sapphire substrate
125 Underside of the substrate
127 Top side of the substrate
129 n-doped semiconductor layer
131 p-doped semiconductor layer
133 Region left free
135 p-bond pad
137 n-bond pad
139 pn junction
141 Beam path
143 Reflective material
145 Predetermined height
147 Height of the semiconductor component
149 Top side of the introduced reflective material
151 Black material
153 Upper edge of the semiconductor component
155 Beam path
157 Beam path
159 Beam path
201 Providing
203 Providing
205 Arranging 207 Filling
209 Filling
301 Using
303 Incorporating
305 Wire contacting
307 Filling
309 Filling
311 Potting
401 Display apparatus
501 Optoelectronic lighting device
503, 505, 507 Optoelectronic semiconductor component
509, 511 Bond wire
513, 515 Contact section
517 Housing
519 Housing frame
521 Cavity

DETAILED DESCRIPTION

Our optoelectronic lighting device may comprise:
at least one optoelectronic semiconductor component comprising a main body comprising a top side and an underside opposite the top side and comprising in each case two opposite side faces connecting the top side to the underside,
a black housing comprising a cavity,
wherein the cavity comprises a base,
the semiconductor component is arranged on the base of the cavity with the underside of the main body facing the base,
the cavity is filled with a reflective material from the base up to a predetermined height, which is smaller than a height of the top side of the main body relative to the base of the cavity such that electromagnetic radiation emerging from the main body through the side faces may be reflected by the reflective material back in the direction of the side faces to couple the reflected electromagnetic radiation into the main body such that at least part of the electromagnetic radiation coupled in may emerge again from the main body through the top side of the main body.

Our method produces an optoelectronic lighting device and may comprise the following steps:
providing at least one optoelectronic semiconductor component, comprising a main body comprising a top side and an underside opposite the top side and comprising in each case two opposite side faces connecting the top side to the underside,
providing a black housing comprising a cavity, wherein the cavity comprises a base,
arranging the semiconductor component on the base of the cavity with the underside of the main body facing the base,
filling the cavity with a reflective material from the base up to a predetermined height, which is smaller than a height of the top side of the main body relative to the base of the cavity such that electromagnetic radiation emerging from the main body through the side faces may be reflected by the reflective material back in the direction of the side faces to couple the reflected electromagnetic radiation into the main body such that at least part of the electromagnetic radiation coupled in may emerge again from the main body through the top side of the main body.

Our display apparatus may comprise the optoelectronic lighting device.

We fill the cavity of the housing in which the semiconductor component is arranged with a reflective material at least up to the predetermined height. This affords the technical advantage, in particular, that electromagnetic radiation emerging from the main body through the side faces is reflected by the reflective material back in the direction of the side faces. This reflected light is then coupled into the main body. This advantageously affords the technical advantage that at least part of the electromagnetic radiation coupled in may emerge again from the main body through the top side of the main body. This is because multiple reflections can generally occur within the main body such that there is an increased probability that the electromagnetic radiation will be reflected in the direction of the top side of the main body and then in this respect may emerge again from the main body. A coupling-out of light from the optoelectronic semiconductor component is thus advantageously increased as a result. Consequently, the electromagnetic radiation that normally, that is to say without the introduced reflective material, emerges through the side faces is not lost, but rather contributes to an increase in the luminous efficiency on account of the reflection and coupling-in again into the main body. Consequently, this affords the technical advantage, in particular, that an efficient coupling-out of light from the optoelectronic semiconductor component may be achieved.

The side faces are thus at least partly, in particular completely, covered by the reflective material. This is on a respective surface of the side faces facing away from the main body, that is to say points outward away from the main body.

Furthermore, providing the black housing affords the technical advantage, in particular, that a contrast of the lighting device may be increased. This is the case particularly when looking at the semiconductor component and the housing from above and when the semiconductor component does not emit any electromagnetic radiation, that is to say is switched off, for example.

"Black" denotes in particular an absence of visible light. That is to say that the black housing emits no visible light. That is to say, in particular, that the black material reflects no light. That is to say, in particular, that the black material and/or respectively the black housing completely absorb(s) all light waves radiated onto it/them, at least more than 90% of the incident light waves.

Light denotes, in particular, electromagnetic radiation in a wavelength range of 380 nm to 780 nm.

White denotes, in particular, a mixture or a mix or a superimposition of individual colors which brings about a color impression comparable to sunlight. That is to say that white scattering particles are configured to reflect and/or to scatter electromagnetic radiation whilst maintaining the color and brightness.

A reflective material denotes a material that, relative to the wavelength or the wavelength range of the electromagnetic radiation emitted by the semiconductor component, comprises a reflectivity of at least 80%, preferably at least 90%, in particular at least 99%, relative to the total amount of electromagnetic radiation incident on the reflective material.

The cavity may be filled with a black material from a top side of the introduced reflective material, the top side facing away from the base of the cavity, up to maximally the upper edge of the semiconductor component, wherein the upper edge is formed by a curve formed by an abutment of the top side of the main body with the side faces. The curve comprises a meniscus shape, for example.

This affords the technical advantage, in particular, that a high contrast may be formed. This is because the lighting device appears particularly black in plan view since the reflective material is covered.

The main body may comprise a reflector that reflects the electromagnetic radiation coupled in away from the underside.

This affords the technical advantage, in particular, that the coupling-out of light through the top side of the main body may be further improved. This is because, by virtue of the provision of such a reflector, the electromagnetic radiation coupled in is efficiently reflected away from the underside in the direction of the top side.

The reflector may form a base of the main body. That is to say that one side of the reflector forms the underside of the main body. This side thus faces the base of the cavity. A further side of the reflector situated opposite the one side thus faces the top side of the main body. The electromagnetic radiation coupled in is then reflected at the further side.

The reflector may be configured as a Bragg mirror. A Bragg mirror denotes a reflector formed from one or more dielectric layers. The designation "distributed Bragg reflector" (DBR) is used. Providing a Bragg mirror affords the technical advantage of efficient reflection, in particular.

The reflector may comprise a thickness of 1 µm to 3 µm, in particular of 2 µm.

Alternatively, the reflector may be configured as a metallic mirror. The reflector is thus a metallic mirror. This affords the technical advantage, for example, that the reflector may be produced in a simple manner.

Alternatively, the main body may be free of a reflector, that is to say in particular free of a mirror. This affords the technical advantage, for example, that the main body can be produced in a simple manner.

Provided that the main body is free of a reflector, the main body may be adhesively bonded on the base of the cavity by a reflective and/or scattering adhesive. The adhesive thus acts as a reflector. The corresponding advantages are analogous to the corresponding advantageous of the reflector. The reflective and/or scattering adhesive comprises in particular a reflectivity for the electromagnetic radiation emitted by the semiconductor component which is greater than 70%, in particular greater than 80%, preferably greater than 90%, in particular greater than 95%.

Provided that the main body is free of a reflector, the base of the cavity may be configured in a reflective fashion. Configured in a reflective fashion means that a reflectivity for the electromagnetic radiation emitted by the semiconductor component is greater than 70%, in particular greater than 80%, preferably greater than 90%, in particular greater than 95%. The reflective base thus acts as a reflector. The corresponding advantages are analogous to the corresponding advantages of the reflector.

The black material and/or the black housing are and/or respectively may be formed from silicone filled with carbon black.

This affords the technical advantage, in particular, that the black material and/or respectively the black housing may be produced in an efficient manner. Carbon black denotes a black, pulverulent solid that predominantly consists of carbon. In particular, predominantly means that the carbon black is formed from carbon to the extent of 80 to 99.5%. The use of carbon black affords the advantages, in particular, that carbon black is cost-effective to produce and is readily available.

The reflective material may be formed from silicone into which white scattering particles are embedded. Silicone affords the technical advantage, in particular, that it is stable in respect of aging. Consequently, a lifetime of the lighting device may advantageously be increased.

This affords the technical advantage, in particular, that the reflective material may be produced in an efficient manner. Scattering particles comprise titanium dioxide scattering particles, for example.

The semiconductor component may be potted with a clear silicone.

This affords the technical advantage, in particular, that the semiconductor component may be efficiently protected against external influences. A clear silicone comprises in particular a transmission of greater than 90% for the electromagnetic radiation emitted by the semiconductor component.

The semiconductor component may be configured as a semiconductor chip.

The semiconductor component may be configured as a light-emitting diode (LED). The light-emitting diode is configured, for example, as a light-emitting diode chip.

The semiconductor component may be configured as a volume-emitting light-emitting diode chip.

A volume-emitting light-emitting diode chip denotes in particular a light-emitting diode chip in which electromagnetic radiation emerges from the light-emitting diode chip not only at the top side but also from the side faces of the light-emitting diode chip. This is in contrast to so-called surface-emitting light-emitting diode chips or so-called surface emitters.

A volume-emitting light-emitting diode chip comprises a transparent substrate, in particular. Transparent denotes a transmission of greater than 90% for the electromagnetic radiation emitted by the light-emitting diode chip.

Providing the reflective material affords the technical advantage, in particular, that the volume-emitting light-emitting diode chip comprises a characteristic like that of a surface emitter. This is because the electromagnetic radiation emerging through the side faces is not lost, but rather is coupled out via the top side of the main body after multiple reflections. Consequently, it is thus advantageously possible to efficiently use volume-emitting light-emitting diode chips in black housings. By way of example, production costs may be reduced as a result. This is because surface emitters (surface-emitting light-emitting diode chips) are usually more expensive than volume-emitting light-emitting diode chips.

A volume-emitting light-emitting diode chip may be contacted by exclusively one bond wire at a top side of the light-emitting diode chip. In this case, a further electrical contacting is effected via a rear side of the light-emitting diode chip, the rear side being opposite the front side. The rear side comprises a rear-side contact, for example, connected by an electrically conductive connection to a substrate on which the light-emitting diode chip is arranged. The substrate is, for example, what may also be referred to as a leadframe.

The semiconductor component may be electrically contacted, for example, by one or more bond wires and/or respectively rear-side and/or respectively front-side contacts. The contacting is carried out in particular after the semiconductor component has been arranged on the base of the cavity. The contacting is carried out in particular before filling with the corresponding materials.

The semiconductor component, in particular the volume-emitting light-emitting diode chip, comprises a substrate, on which one or more semiconductor layers is/are applied, for example, grown.

The substrate is, for example, one of the following substrates: sapphire substrate, SiC substrate (SiC: silicon carbide).

The semiconductor layers comprise, for example, the following semiconductor layers: InGaAlP layer, GaP layer (GaP: gallium phosphide), GaN layer.

A semiconductor layer comprises, for example, a thickness of 8 µm to 12 µm, in particular of 10 µm.

The predetermined height may be a maximum of two thirds, in particular two thirds, of the height of the top side relative to the base.

This affords the technical advantage, in particular, that an efficient reflection of the electromagnetic radiation emerging from the side faces back in the direction of the side faces may be effected. The predetermined height may be 60 µm to 150 µm, for example.

The semiconductor component height or semiconductor component thickness is 80 µm to 200 µm, for example.

Examples of the lighting device arise analogously from example of the method, and vice-versa. That is to say that technical functionalities of the lighting device arise analogously from corresponding technical functionalities of the method, and vice-versa. Explanations given correspondingly in association with the lighting device are analogously applicable to the method, and vice-versa.

The method may comprise filling the cavity with a black material from a top side of the introduced reflective material, the top side facing away from the base of the cavity, up to maximally the upper edge of the semiconductor component, wherein the upper edge is formed by a line formed by an abutment of the top side of the main body with the side faces.

The main body may comprise a reflector that reflects the electromagnetic radiation coupled in away from the underside.

The black material and/or the black housing may be and/or respectively formed from silicone filled with carbon black.

The reflective material may be formed from silicone into which white scattering particles are embedded.

The semiconductor component may be potted with a clear silicone.

The semiconductor component may be configured as a volume-emitting light-emitting diode chip.

The predetermined height may be a maximum of two thirds, in particular two thirds, of the height of the top side relative to the base.

The optoelectronic lighting device may have been or respectively may be produced by the method of producing an optoelectronic lighting device.

The display apparatus may comprise a plurality of optoelectronic lighting devices.

The display apparatus is configured, for example, as a video wall or as a display panel (VMS: Variable Message Signs) or as a screen. Consequently, a VMS is, in particular, a variable display panel or message sign.

By way of example, the lighting device may comprise a plurality of optoelectronic semiconductor components arranged in the cavity. This is analogous to the example comprising one semiconductor component. The plurality of semiconductor components are configured substantially analogously to the one semiconductor component, but may be configured, for example, to emit different wavelengths, for example, different colors. In this regard, by way of example, it is possible to configure an RGB lighting device comprising a semiconductor component that emits red light, a semiconductor component that emits green light and a semiconductor component that emits blue light. In a plurality of semiconductor components as well, the cavity is analogously filled with the reflective material and in particular with the black material. The explanations given above and below are analogously applicable to a plurality of semiconductor components.

The material (that is to say the reflective material and/or the black material) may comprise one or more of the following materials and/or respectively is such a material: silicone, epoxy, silicone-epoxy hybrid.

The housing may be formed from one or more of the following materials and/or respectively comprises one or more of the following materials: silicone, epoxy, silicone-epoxy hybrid, PPA (polyphthalamide), PCT (polycyclohexylene dimethylene terephthalate), plastic.

The above-described properties, features and advantages of our devices, apparatus and methods and the way in which they are achieved will become clearer and more clearly understood in association with the following description of the examples which are explained in greater detail in association with the drawings.

FIG. 1 shows an optoelectronic lighting device 101 in a lateral sectional view.

The optoelectronic lighting device 101 comprises an optoelectronic semiconductor component 103. The optoelectronic semiconductor component 103 is configured, for example, as a volume-emitting light-emitting diode chip.

The semiconductor component 103 comprises a main body 105. The main body 105 comprises a top side 107. The main body 105 comprises an underside 109 opposite the top side 107 of the main body 105.

Furthermore, two opposite side faces 110 are provided, which each connect the underside 109 to the top side 107. That is to say that the semiconductor component 103 comprises a main body 105 comprising two opposite side faces 110, wherein the side faces 110 each connect the top side 107 and the underside 109 to one another.

The optoelectronic lighting device 101 comprises a housing 111. The housing 111 is configured as a black housing. By way of example, the housing 111 comprises a silicone filled with carbon black.

The housing 111 comprises a housing frame 113 in which a leadframe 114 is embedded. The leadframe 114 comprises copper, for example, or is formed from copper. In one example, the leadframe 114 comprises an electrolytic coating for protection and/or increasing reflectivity.

The leadframe 114 brings about in particular the following:

thermal spreading and heat dissipation, and electrical contacting of the semiconductor component since wires are drawn from bond pads (as discussed below) to the leadframe 114, but this is not illustrated here for the sake of clarity.

The housing 111 comprises a cavity 115 formed as a depression in the housing frame 113. The cavity 115 comprises a base 119 and a wall 117 extending circumferentially around the base 119, the wall being formed as a lateral surface of the cavity 115.

The main body 105 is arranged by its underside 109 on the base 119 of the cavity 115. In this case, the base 119 of the cavity 115 is formed by the leadframe 114. That is to say that the main body 105 of the semiconductor component 103 is arranged by its underside 109 on the leadframe 114.

The main body 105 of the semiconductor component 103 is constructed in a multipartite fashion. That is to say that the main body 105 comprises a plurality of parts or elements, that is to say an arrangement of elements or parts.

The main body 105 comprises a Bragg reflector 121. One side of the Bragg reflector 121 forms the underside 109 of the main body 105. That is to say that the semiconductor component 103 is arranged with the Bragg reflector 121 on the leadframe 114.

The main body 105 furthermore comprises a sapphire substrate 123 comprising a top side 127 and an underside 125 opposite the top side 127. In this case, the Bragg reflector 121 is arranged at the underside 125 of the sapphire substrate 123. The underside 125 of the sapphire substrate 123 faces the base 119 of the cavity 115. The top side 127 of the sapphire substrate 123 faces away from the base 119 of the cavity 115.

The sapphire substrate 123 denotes a substrate composed of a monocrystalline sapphire. In another example, an SiC substrate (SiC: silicon carbide) is provided instead of the sapphire substrate 123.

An n-doped semiconductor layer 129 is arranged or applied, in particular grown, on the top side 127 of the sapphire substrate 123.

A p-doped semiconductor layer 131 is applied, in particular grown, or deposited on the n-doped semiconductor layer 129. In this case, the p-doped semiconductor layer 131 is not applied completely on the n-doped semiconductor layer 129. That is to say that the n-doped semiconductor layer 129 comprises a region that is free of the p-doped semiconductor layer 131. That is to say that the p-doped semiconductor layer 131 is only partly applied on the n-doped semiconductor layer 129. This region left free is identified by a curly bracket with the reference sign 133.

A pn junction 139 is thus formed between the n-doped semiconductor layer 129 and the p-doped semiconductor layer 131.

Bond pads 135, 137 are provided to electrically contact the two semiconductor layers 129, 131. In this case, the reference sign 135 indicates the bond pad to electrically contact the p-doped semiconductor layer 131. The bond pad 135 may thus be referred to as a p-bond pad.

The reference sign 137 indicates the bond pad that electrically contacts the n-doped semiconductor layer 129. That is to say that the bond pad 137 may be referred to as an n-bond pad.

The bond pads 135, 137 are contacted by a wire, for example, such that an electrical connection to the bond pads 135, 137 may be produced via the wire. This process may be referred to as wire contacting of the semiconductor component 103. The wire contacting is not shown here for the sake of clarity. Consequently, corresponding wires are not shown for the sake of clarity. The wires to the bond pads 135, 137 are drawn to the leadframe 114 such that an electrical contacting of the two semiconductor layers 129, 131 is made possible via the leadframe 114.

Alternatively, the semiconductor component 103 is configured as a flip-chip, for example, as a sapphire flip-chip. That is to say that the electrical contacts (bond pads) are arranged at the rear side of the chip. The chip is thus contacted from its rear side. That is to say that the two bond pads 135, 137 are applied directly conductively on the leadframe 114.

If an electrical voltage is applied to the semiconductor layers 129, 131 via the bond pads 135, 137, electromagnetic radiation is generated in the region of the pn junction 139. An exemplary beam path of this generated electromagnetic radiation is identified by an arrow with the reference sign 141.

The emitted or generated electromagnetic radiation impinges at least partly on the side faces 110. In general, the radiation would then emerge from the main body 105 through the side faces 110.

Provision is made for a reflective material 143 to be used to fill the cavity 115 up to a predetermined height 145. The predetermined height 145 is smaller than the height of the semiconductor component 103 relative to the base 119 of the cavity 115. The predetermined height 145 is also defined relative to the base 119.

By virtue of the provision of the reflective material 143, although the electromagnetic radiation 141 will first emerge through the side faces 110 of the main body 105, it will then be reflected there by the reflective material 143 back to the side faces 110 and then be incident into, or enter, the main body 105 again through the side faces 110.

The electromagnetic radiation reflected by the reflective material 143 is identified here symbolically by an arrow with the reference sign 155.

The reflective material 143 comprises, for example, a silicone into which white scattering particles are embedded. Scattering particles are titanium dioxide particles, for example.

The height of the semiconductor component 103 relative to the base 119 of the cavity 115 is identified symbolically by a curly bracket with the reference sign 147.

Furthermore, the cavity 115, after filling with the reflective material 143, is also partly filled with a black material 151. In this case, the black material 151 is applied on a top side 149 of the introduced reflective material 143. The filling by the black material 151 is carried out up to the upper edge 153 of the semiconductor component 103. That is to say that the cavity 115 is filled with the black material 151 up to the upper edge 153 of the semiconductor component 103. In this case, the upper edge 153 is formed by a line formed by an abutment of the top side 107 of the main body 105 with the side faces 110.

The upper edge 153 of the semiconductor component 103 may also be referred to as a chip upper edge.

The black material 151 comprises, for example, a silicone filled with carbon black.

An example that is not shown provides for the semiconductor component 103 subsequently also to be potted with a clear silicone.

The wire contacting is carried out before the process of filling the cavity by the reflective material and the black material.

The reflected electromagnetic radiation 155 will, for example, impinge on the Bragg reflector 121 and be reflected again by the latter in the direction of the opposite side face 110. This reflected electromagnetic radiation is identified symbolically by an arrow with the reference sign 157.

The radiation 157, analogously to the radiation 141, will emerge from the main body 105 through the side face 110 to be reflected back to the side face 110 again by the reflective material 143 to be incident again into the main body 105.

The electromagnetic radiation is then reflected from the side face 110 in the direction of the top side 107 of the main body 105. This reflected radiation is identified symbolically by an arrow with the reference sign 159. This electromagnetic radiation 159 may then emerge through the top side 107 of the main body 105.

That is to say that electromagnetic radiation reflected back in the direction of the main body 105 on account of the reflective material 143 couples or penetrates or is incident again into the main body 105 and on account of multiple reflections within the main body 105 and/or on account of a further reflection on account of the reflective material 143 at the opposite side face 110 is reflected in the direction of the top side 107 and thus couples out from the main body 105 upward.

If white scattering particles are provided in the reflective material 143, then a not necessarily direction-maintaining scattering generally takes place at the scattering particles.

This affords the technical advantage, in particular, that a coupling-out of light or generally a coupling-out of electromagnetic radiation from the main body 105 and thus from the semiconductor component 103 may be efficiently increased. The semiconductor component 103 may thus couple out light very efficiently in the switched-on state.

Provision of the black material 151 affords the technical advantage, in particular, that the semiconductor component 103 appears particularly black in a plan view and thus comprises a high contrast. This is particularly when the component 103 is switched off.

This effect may advantageously be intensified by a particularly thin black layer composed of reflective material 143 and the greatest possible amount of white-filled silicone, that is to say reflective material 143.

"The greatest possible amount" means that between 65% and 75% of the chip height is filled with the reflective material. "Particularly thin" means that correspondingly 25% to 35% is filled with the black material.

In one example, a thickness of the black material is 8 μm to 12 μm, in particular 10 μm.

Provision of the reflective material 143 advantageously enables the semiconductor component 103 to be given a characteristic like that of a surface emitter. Consequently, it is advantageously possible to efficiently use volume-emitting light-emitting diode chips, that is to say volume emitters, in black housings.

Figure 2:
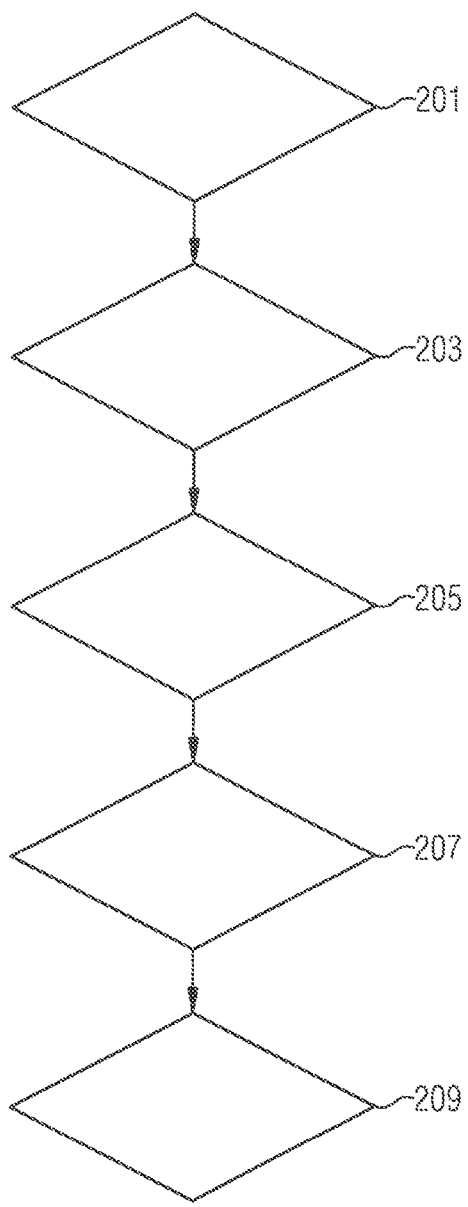
FIG. 2 shows a flow diagram of a method of producing an optoelectronic lighting device.

FIG. 2 shows a flow diagram of a method of producing an optoelectronic lighting device.

This may involve, for example, the optoelectronic lighting device 101 from FIG. 1.

The method comprises the following steps:

providing 201 at least one optoelectronic semiconductor component, comprising a main body comprising a top side and an underside opposite the top side and each comprising two opposite side faces connecting the top side to the underside, providing 203 a black housing comprising a cavity, wherein the cavity comprises a base, arranging 205 the semiconductor component on the base of the cavity with the underside of the main body facing the base, filling 207 the cavity with a reflective material from the base up to a predetermined height, which is smaller than a height of the top side of the main body relative to the base of the cavity such that electromagnetic radiation emerging from the main body through the side faces may be reflected by the reflective material back in the direction of the side faces to couple the reflected electromagnetic radiation into the main body such that at least part of the electromagnetic radiation coupled in may emerge again from the main body through the top side of the main body, and filling 209 the cavity with a black material from a top side of the introduced reflective material, the top side facing away from the base of the cavity, up to maximally the upper edge of the semiconductor component, wherein the upper edge is formed by a line formed by an abutment of the top side of the main body with the side faces.

After arranging in accordance with step 205, by way of example, wire contacting of the semiconductor component is provided.

Steps 201 and 203 may also be carried out in the opposite order or simultaneously. Step 209 is an optional step that serves to increase contrast. In one example, step 209 is not provided.

Figure 3:
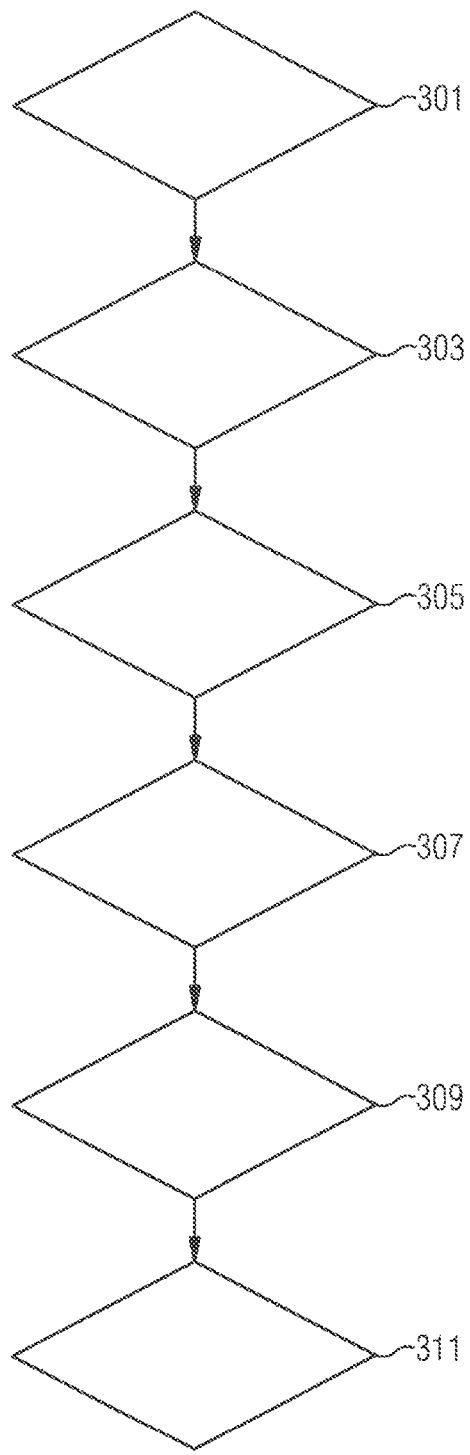
FIG. 3 shows a flow diagram of a further method of producing an optoelectronic lighting device.

FIG. 3 shows a flow diagram of a further method of producing an optoelectronic lighting device.

This may involve, for example, the optoelectronic lighting device 101 from FIG. 1.

In a step 301, a use of a black housing is provided. That is to say that a black housing 301 is used or provided in accordance with step 301. The black housing is the housing 111 in accordance with FIG. 1.

In a step 303, provision is made for a volume-emitting light-emitting diode chip to be incorporated into the black housing. In this case, the light-emitting diode chip is incorporated or arranged at the base of the cavity of the housing 111.

In a step 305, wire contacting of the bond pads 135, 137 of the light-emitting diode chip then takes place.

In a step 307, the cavity of the housing is filled with highly reflective white-filled silicone up to approximately two thirds of the chip height (60 μm to 150 μm).

Afterward, that is to say after this filling in accordance with step 307, in accordance with a step 309, the cavity is filled further with a black (carbon-black-filled) silicone up to the chip upper edge.

In a step 311, the light-emitting diode chip is then potted with a clear silicone. This takes place, therefore, after filling in accordance with steps 307 and 309.

As a result of filling with a white-filled silicone, the light, generally electromagnetic radiation, coming laterally from the light-emitting diode chip is reflected back into the chip and coupled out upward after a plurality of reflections within the chip. The coupling-out of light thus becomes very high and the light-emitting diode chip very bright.

By virtue of the black-filled silicone, the light-emitting diode chip becomes particularly black in a plan view and thus comprises a high contrast. According to one example, this effect is intensified by a particularly thin black layer and the greatest possible amount of white-filled silicone.

The white-filled silicone thus advantageously gives the volume-emitting light-emitting diode chip a characteristic like that of a surface emitter. Consequently, it is possible to efficiently use volume-emitting chips in black housings.

According to one example, the optoelectronic lighting device is used in a video wall or in a display, that is to say a screen.

Figure 4:
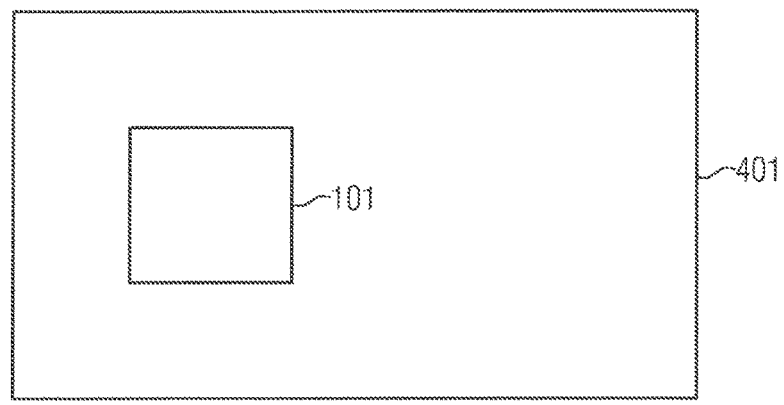
FIG. 4 shows a display apparatus.

Consequently, a display apparatus 401 comprising the optoelectronic lighting device 101 is thus generally provided in accordance with FIG. 4. In particular, the display apparatus 401 comprises a plurality of the optoelectronic lighting devices 101.

The display apparatus 401 is configured, for example, as a video wall or as a screen.

According to one example, the lighting device 101 comprises a plurality of semiconductor components 103 correspondingly surrounded with reflective material and black material analogously to the one semiconductor component 103 shown in FIG. 1. According to one example, provision is made for a dedicated housing to be provided for each of the plurality of semiconductor components. In one example, provision is made for the plurality of semiconductor components to be arranged in a common housing (cf. FIG. 5).

Figure 5:
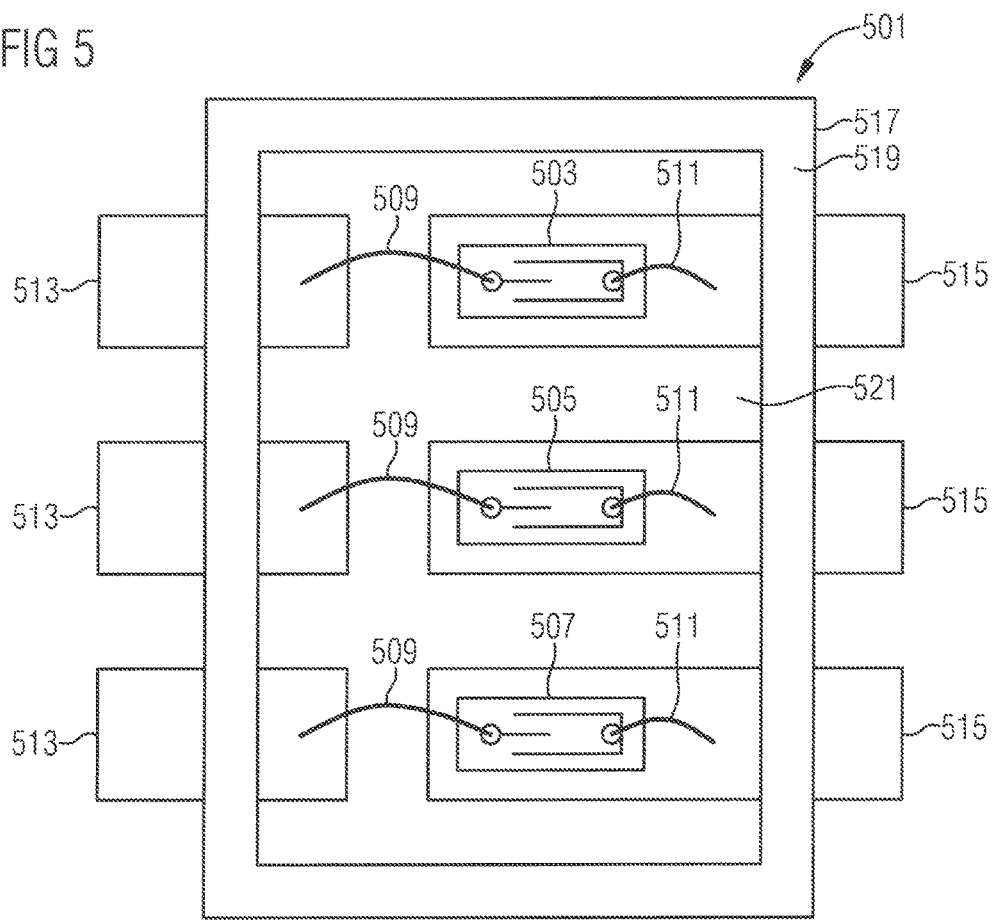
FIG. 5 shows a further optoelectronic lighting device.

FIG. 5 shows a further optoelectronic lighting device 501 in a plan view from above illustrated in a simplified manner.

The lighting device 501 comprises three optoelectronic semiconductor components 503, 505, 507 configured analogously to the semiconductor component 103. The three semiconductor components 503, 505, 507 are configured, for example, to emit red, green and blue light, respectively. Consequently, by way of example, an RGB lighting device is created (RGB: red, green, blue) which, by way of example, may form a pixel in a video wall.

The semiconductor components 503, 505, 507 are each electrically contacted or connected by two bond wires 509, 511 respectively to electrical contact sections 513, 515 of a leadframe (not illustrated in further detail). One respective bond wire 509 contacts, for example, a respective p-doped semiconductor layer (not shown) of the semiconductor components 503, 505, 507, and the respective other bond wire 511 contacts, for example, a respective n-doped semiconductor layer (not shown) of the semiconductor components 503, 505, 507, or vice-versa. This is, for example, analogous to the lighting device 101 in FIG. 1.

The lighting device 501 comprises a housing 517 comprising a housing frame 519. The housing 517 comprises a cavity 521 surrounded or enclosed by the housing frame 519.

The three semiconductor components 503, 505, 507 are arranged in the cavity 521 on the base thereof (not shown), wherein the base is formed by the leadframe.

Analogously to the lighting device 101, in the lighting device 501, provision is made for a reflective material to be introduced or potted in the cavity 521 from the base up to a predetermined height, which is smaller than the semiconductor component height, wherein a black material is applied on the introduced or potted reflective material, for example, by potting. A total thickness of the two materials is less than or equal to the semiconductor component height relative to the base of the cavity 521.

The three semiconductor components 503, 505, 507 are surrounded with reflective material and black material analogously to the semiconductor component 103. A cross-sectional view of the lighting device 501 would thus be similar to the cross-sectional view in accordance with FIG. 1, wherein as a difference two further semiconductor components would also be provided on the left and right next to the semiconductor component 103.

Although our devices, apparatus and methods have been more specifically illustrated and described in detail by the preferred examples, nevertheless this disclosure is not restricted by the examples disclosed and other variations may be derived therefrom by those skilled in the art, without departing from the scope of protection of the appended claims.

This application claims priority of DE 10 2015 112 042.9, the subject matter of which is incorporated herein by reference.

The invention claimed is:

1. An optoelectronic lighting device comprising:
at least one optoelectronic semiconductor component comprising a main body comprising a top side and an underside opposite the top side and each comprising two opposite side faces connecting the top side to the underside, and
a black housing comprising a cavity,
wherein the cavity comprises a base,
the semiconductor component is arranged on the base of the cavity with the underside of the main body facing the base, and
the cavity is filled with a reflective material from the base up to a predetermined height, which is smaller than a height of the top side of the main body relative to the base of the cavity such that electromagnetic radiation emerging from the main body through the side faces may be reflected by the reflective material back in the direction of the side faces to couple the reflected electromagnetic radiation into the main body such that at least part of the electromagnetic radiation coupled in may emerge again from the main body through the top side of the main body, wherein the cavity is filled with a black material from a top side of the introduced reflective material, said top side facing away from the base of the cavity, up to maximally the upper edge of the semiconductor component, and the upper edge is formed by a curve formed by an abutment of the top side of the main body with the side faces.

2. The optoelectronic lighting device as claimed in claim 1, wherein the main body comprises a reflector that reflects the electromagnetic radiation coupled in away from the underside.

3. The optoelectronic lighting device as claimed in claim 1, wherein the black material and/or the black housing are and/or respectively is formed from silicone filled with carbon black.

4. The optoelectronic lighting device as claimed in claim 1, wherein the reflective material is formed from silicone into which white scattering particles are embedded.

5. The optoelectronic lighting device as claimed in claim 1, wherein the semiconductor component is potted with a clear silicone.

6. The optoelectronic lighting device as claimed in claim 1, wherein the semiconductor component is configured as a volume-emitting light-emitting diode chip.

7. The optoelectronic lighting device as claimed in claim 1, wherein the predetermined height is a maximum of two thirds of the height of the top side relative to the base.

8. A display apparatus, comprising the optoelectronic lighting device as claimed in claim 1.

9. The display apparatus as claimed in claim 8, configured as a video wall or as a screen.

10. An optoelectronic lighting device comprising:
at least one optoelectronic semiconductor component comprising a main body comprising a top side and an underside opposite the top side and each comprising two opposite side faces connecting the top side to the underside, and
a black housing comprising a cavity,
wherein the cavity comprises a base,
the semiconductor component is arranged on the base of the cavity with the underside of the main body facing the base, and
the cavity is filled with a reflective material from the base up to a predetermined height, which is smaller than a height of the top side of the main body relative to the base of the cavity such that electromagnetic radiation emerging from the main body through the side faces may be reflected by the reflective material back in the direction of the side faces to couple the reflected electromagnetic radiation into the main body such that at least part of the electromagnetic radiation coupled in may emerge again from the main body through the top side of the main body, wherein the black housing is formed from silicone filled with carbon black.

11. A display apparatus, comprising the optoelectronic lighting device as claimed in claim 10.

12. The display apparatus as claimed in claim 11, configured as a video wall or as a screen.

13. The optoelectronic lighting device as claimed in claim 10, wherein the cavity is filled with a black material from a top side of the introduced reflective material, said top side facing away from the base of the cavity, up to maximally the upper edge of the semiconductor component, and the upper edge is formed by a curve formed by an abutment of the top side of the main body with the side faces.

14. The optoelectronic lighting device as claimed in claim 10, wherein the reflective material is formed from silicone into which white scattering particles are embedded.

15. An optoelectronic lighting device comprising:
at least one optoelectronic semiconductor component comprising a main body comprising a top side and an underside opposite the top side and each comprising two opposite side faces connecting the top side to the underside, and
a black housing comprising a cavity,
wherein the cavity comprises a base,
the semiconductor component is arranged on the base of the cavity with the underside of the main body facing the base, and
the cavity is filled with a reflective material from the base up to a predetermined height, which is smaller than a height of the top side of the main body relative to the base of the cavity such that electromagnetic radiation emerging from the main body through the side faces may be reflected by the reflective material back in the direction of the side faces to couple the reflected electromagnetic radiation into the main body such that at least part of the electromagnetic radiation coupled in may emerge again from the main body through the top side of the main body, wherein the reflective material is formed from silicone into which white scattering particles are embedded.

16. A display apparatus, comprising the optoelectronic lightning device as claimed in claim 15.

17. The display apparatus as claimed in claim 16, configured as a video wall or as a screen.

18. The optoelectronic lighting device as claimed in claim 15, wherein the cavity is filled with a black material from a top side of the introduced reflective material, said top side facing away from the base of the cavity, up to maximally the upper edge of the semiconductor component, and the upper edge is formed by a curve formed by an abutment of the top side of the main body with the side faces.

19. The optoelectronic lighting device as claimed in claim 18, wherein the black material and/or the black housing are and/or respectively is formed from silicone filled with carbon black.

* * * * *